(12) United States Patent
Iwata et al.

(10) Patent No.: US 6,787,410 B2
(45) Date of Patent: Sep. 7, 2004

(54) SEMICONDUCTOR DEVICE HAVING DYNAMIC THRESHOLD TRANSISTORS AND ELEMENT ISOLATION REGION AND FABRICATION METHOD THEREOF

(75) Inventors: Hiroshi Iwata, Nara-ken (JP); Akihide Shibata, Nara (JP); Seizo Kakimoto, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 75 days.

(21) Appl. No.: 10/322,663

(22) Filed: Dec. 19, 2002

(65) Prior Publication Data
US 2003/0107103 A1 Jun. 12, 2003

Related U.S. Application Data

(62) Division of application No. 10/067,791, filed on Feb. 8, 2002, now Pat. No. 6,509,615.

(30) Foreign Application Priority Data
Feb. 8, 2001 (JP) .......................................... 2001-032051

(51) Int. Cl.$^7$ .......................................... H01L 21/8238
(52) U.S. Cl. ........................ 438/221; 438/199; 438/223; 438/224; 438/227; 438/228; 438/404; 438/424
(58) Field of Search ................................. 438/199, 221, 438/223, 224, 227, 228, 404, 424

(56) References Cited

U.S. PATENT DOCUMENTS

| | | | |
|---|---|---|---|
| 4,927,777 A | * | 5/1990 | Hsu et al. .................... 438/305 |
| 5,015,594 A | * | 5/1991 | Chu et al. .................... 438/207 |
| 5,573,969 A | * | 11/1996 | Kim ........................... 438/224 |
| 5,780,899 A | | 7/1998 | Hu et al. |
| 5,874,328 A | * | 2/1999 | Liu et al. ..................... 438/199 |
| 6,172,405 B1 | | 1/2001 | Shibata et al. |
| 6,255,704 B1 | | 7/2001 | Iwata et al. |
| 6,288,429 B1 | | 9/2001 | Iwata et al. |
| 6,376,296 B2 | * | 4/2002 | Tung .......................... 438/221 |
| 6,426,532 B1 | | 7/2002 | Iwata et al. |

FOREIGN PATENT DOCUMENTS

| | | |
|---|---|---|
| JP | 10-22462 A | 1/1998 |
| WO | WO 01/01481 | 1/2002 |

* cited by examiner

*Primary Examiner*—Tom Thomas
*Assistant Examiner*—N. Drew Richards
(74) *Attorney, Agent, or Firm*—Birch, Stewart, Kolasch & Birch, LLP

(57) ABSTRACT

A semiconductor device with dynamic threshold transistors includes a complex element isolation region composed of a shallow element isolation region made of shallow trench isolation and deep element isolation regions provided on both sides of the shallow element isolation region. Since the shallow element isolation region is made of the shallow trench isolation, Bird's beak in the shallow element isolation region is small. This prevents off leakage failure due to stress caused by the bird's beak. The deep element isolation region has an approximately constant width which allows the complex element isolation region to be wide.

2 Claims, 16 Drawing Sheets

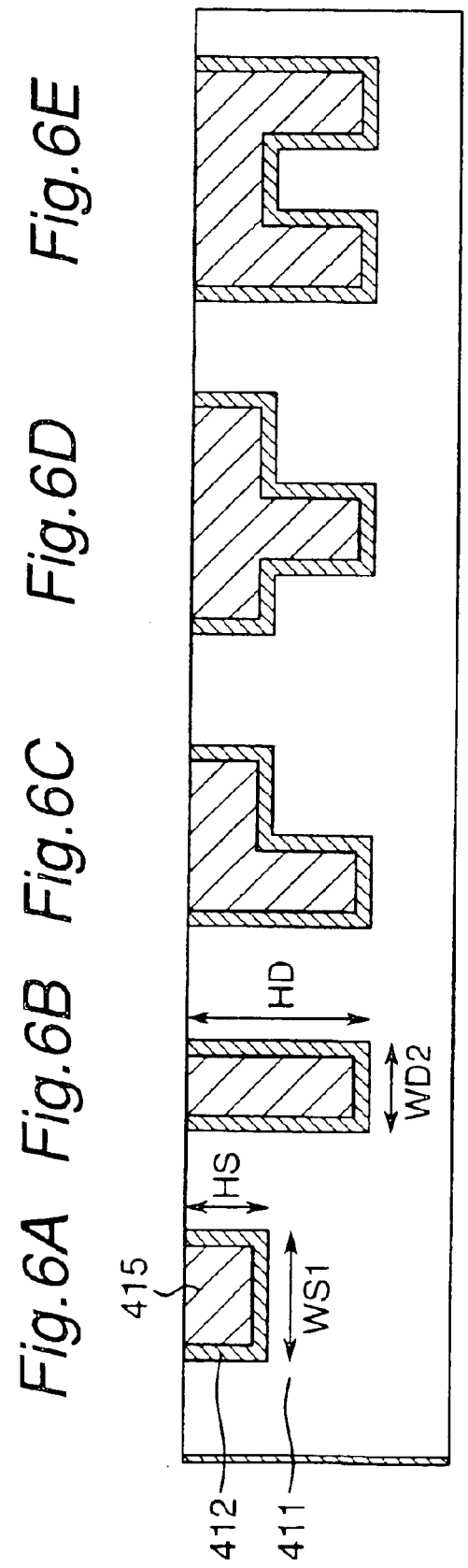

SEMICONDUCTOR DEVICE HAVING DYNAMIC THRESHOLD TRANSISTORS AND ELEMENT ISOLATION REGION AND FABRICATION METHOD THEREOF

This application is a divisional of application Ser. No. 10/067,791, filed on Feb. 8, 2002, now U.S. Pat. No. 6,509,615, the entire contents of which are hereby incorporated by reference and for which priority is claimed under 35 U.S.C. §120; and this application claims priority of Application No. 2001-032051 filed in Japan on Feb. 8, 2001 under 35 U.S.C. §119.

BACKGROUND OF THE INVENTION

The present invention relates to a semiconductor device provided with a field effect transistor such as MOSFET (Metal Oxide Semiconductor Field Effect Transistor) and an element isolation region, and more particularly to a semiconductor device provided with a dynamic threshold transistor with a gate electrode being electrically connected to a well region and with an element isolation region.

As a technique to achieve considerable reduction in power consumption by decrease of operating voltage in CMOS (Complementary Metal Oxide Semiconductor) circuits using MOSFET, there has been proposed a dynamic threshold transistor (hereinbelow referred to as DTMOS) using a bulk substrate in Japanese Patent Laid-Open Publication HEI No. 10-22462, Japanese Patent Laid-Open Publication No. 2000-82815, and Novel Bulk Threshold Voltage MOSFET (B-DTMOS with Advanced Isolation (SITOS) and Gate to Shallow Well Contact (SSS-C) Processes for Ultra Low Power Dual Gate CMOS H. Kotaki et al., IEDM Tech. Digs, p 439, 1996.

A schematic cross sectional view of N-type and P—type DTMOS is shown in FIG. 13. In FIG. 13, there are shown a substrate 111, an N-type deep well region 112, a P-type deep well region 113, a P-type shallow well region 114, an N-type shallow well region 115, an element isolation region 116, an N-type source region 117, an N-type drain region 118, a P-type source region 119, a P-type drain region 120, a gate insulator 121, a gate electrode 122, an N-type DTMOS 123, and a P-type DTMOS 124. In addition, though not shown in FIG. 13, the gate electrode 122 in the N-type DTMOS 123 is electrically connected to the P-type shallow well region 114 through a contact hole. Similarly, the gate electrode 122 in the P-type DTMOS 124 is electrically connected to the N-type shallow well region 115 through a contact hole. The element isolation region 116 of FIG. 13 is shown in detail in FIG. 14. The element isolation region 116 is made up of a LOCOS (Local Oxidation of Silicon) oxide portion 125 and a trench portion 126.

Hereinbelow, the principle of DTMOS operation will be described in the case of the N-type DTMOS 123 with reference to FIG. 13. In the N-type DTMOS 123, when the gate electrode 122 is in a low potential level (OFF state), the shallow well region 114 is also in a low potential level and so the effective threshold thereof is the same as that of typical MOSFET. Therefore, an OFF-state current value (OFF leakage) thereof is also identical to that of typical MOSFET.

When the gate electrode 122 is in a high potential level (ON state), the shallow well region 114 is also in a high potential level, which decreases the effective threshold due to substrate bias effect, thereby generating driving current larger than that of typical MOSFET. This makes it possible to obtain large driving current while low leakage current being maintained with low power supply voltage.

In the DTMOS 123 and 124, as stated above, each gate electrode 122 is electrically short-circuited to the shallow well regions 114 and 115. Consequently, if the potential of the gate electrode 122 changes, the potential of the shallow well regions 114, 115 also changes. This necessitates electrical isolation of the shallow well region 114, 115 of each DTMOS 123, 124 from shallow well regions of adjacent MOSFET. The trench portion 126 of the element isolation region 116 is configured to have a depth so as to isolate the shallow well regions of adjacent MOSFET from each other. The LOCOS oxide portion 125 of the element isolation region 116 is, for examples provided on an interconnection part of the gate electrode 122, for decreasing capacitance between the gate region and the well region.

Increasing miniaturization of elements makes the distance (Wsd in FIG. 13) front the edge of the gate electrode to the element isolation region smaller and smaller. To cope with this situation, there was fabricated a P-type MOS having a stacked-up type of source and drain regions which makes it possible to minimize the source region and drain region (a structure and fabrication method thereof is disclosed in Japanese Patent Laid-Open Publication No. 2000-82815). As a result of measuring the transistor characteristics thereof, abnormal leakage current was found in the P-type MOS. FIG. 15 shows changes of drain current versus gate voltage, in which a solid line indicates smaller Wsd (Wsd= 0.40 µm) and a dashed line indicates larger Wsd (Wsd=11.0 µm).

The leakage current was seen only in P-type MOS whose Wsd is small. Even with the same Wsd, leakage current values showed considerable difference per element. It is noted that these elements stated above are different only in Wsd and are equal in such factors as a gate length, a gate width, and a high impurity concentration of channel. In the example of FIG. 15, when gate voltage is 0V (the transistor is OFF), off current marks four digits increase in the case of Wsd=0.4 µm compared to the case of Wsd=1.0 µm, which causes leakage current in CMOS circuits, and thereby disturbs reduction of power consumption.

Off leakage failure of P-type MOS stated as the problem to be solved by the present invention may be attributed to the following. That is, bird's beak generated in the process of LOCOS oxidation approaches the end of the gate electrode, as a result of which stress originated from the bird's beak causes abnormal dissipation of impurities at the end of the gate electrode or the gate oxide film. Abnormal dissipation of impurities partially reduces impurity concentration of channel, thereby causing increase of off leakage.

SUMMARY OF THE INVENTION

For solving the above problem, an object of the present invention is to provide a semiconductor device with use of DTMOS which does not cause increased off leakage failure even if the distance from the end of the gate electrode to the element isolation region is shortened by miniaturization of elements, and to provide a fabrication method thereof.

The present invention provides a semiconductor device, comprising:

a semiconductor substrate;

a first conductive-type deep well region formed inside the semiconductor substrate;

a second conductive-type shallow well region formed in the first conductive-type deep well region;

a dynamic threshold transistor formed on the second conductive-type shallow well region, a gate electrode of the dynamic threshold transistor being short-circuited to the second conductive-type shallow well region;

a shallow element isolation region formed on the second conductive-type shallow well region and composed of STI with a depth shallower than a depth of an interface between the first conductive-type deep well region and the second conductive-type shallow well region; and a deep element isolation region formed on the first conductive-type deep well region by penetrating through the second conductive-type shallow well region and having a depth deeper than the depth of the interface between the first conductive-type deep well region and the second conductive-type shallow well region.

In this description, the first conductive type refers to either a P type or an N type, whereas the second conductive type refers to an N type if the first conductive type is a P type, and to a P type if the first conductive type is an N type.

According to the above invention, the element isolation region is composed of a deep element isolation region and a shallow element isolation region made of STI. Consequently, even if the dynamic threshold transistor is composed of PMOS, off leakage failure of PMOS is not only prevented due to stress caused by bird's beak, but also embedding of an insulating film in the element isolation region is facilitated. Further, the element isolation region composed of a deep element isolation region and a shallow element isolation region made of STI makes it possible to decrease element and inter-element margins.

In one embodiment of the present invention, the semiconductor device further comprises:

a second conductive-type deep well region formed inside the semiconductor substrate;

a first conductive-type shallow well region formed in the second conductive-type deep well region;

a dynamic threshold transistor formed on the first conductive-type shallow well region, a gate electrode of the dynamic threshold transistor being short-circuited to the first conductive-type shallow well region;

a shallow element isolation region formed on the first conductive-type shallow well region and composed of STI with a depth shallower than a depth of an interface between the second conductive-type deep well region and the first conductive-type shallow well region;

a deep element isolation region formed on the second conductive-type deep well region by penetrating through the first conductive-type shallow well region and having a depth deeper than the depth of the interface between the second conductive-type deep well region and the first conductive-type shallow well region; and an interface element isolation region provided at an interface between the first conductive-type and second conductive-type deep well regions and between the first conductive-type and second conductive-type shallow well regions.

The semiconductor device of the above embodiment is structured in a complementary form with use of the semiconductor device of the above-stated invention. Therefore, the dynamic threshold transistors have symmetrical output characteristics, and power consumption is decreased.

In one embodiment of the present invention, at least one of the deep element isolation regions has an approximately constant width. The approximately constant width makes it easy to form the deep element isolation region.

In one embodiment of the present invention, the dynamic threshold transistor has a stacked-up type structure in which a part of a source region and a part of a drain region of the dynamic threshold transistor exist above a plane formed by a gate insulating film of the dynamic threshold transistor.

According to the above embodiment, forming the source region and the drain region in a stacked-up type makes it easy to decrease depth of interface of the source region and the drain region with the shallow well region Also, the source region and the drain region formed in the stacked-up type are considerably reduced in area. Therefore, an area of the element is further decreased, and highly integrated circuits including dynamic threshold transistors are provided.

In one embodiment of the present invention, the interface element isolation region is a complex element isolation region comprising a shallow element isolation region made of STI with a depth shallower than the depth of the interface between the shallow well region and the deep well region and deep element isolation regions disposed on both sides of the shallow element isolation region with a depth deeper than the depth of the interface and an approximately constant width.

According to the above embodiment, compared to the case of simply providing a deep element isolation region with a large width, embedment of an oxide film is facilitated, which makes it relatively easy to form a complex element isolation region with a large width. Since the deep element isolation regions are present on octal sides of the shallow element isolation region, there is effectively prevented punchthrough between the first conductive-type deep well region and the first conductive type shallow well region, or between the second conductive type deep well region and the second conductive-type shallow well region. Therefore, a plurality of dynamic threshold transistors are effectively isolated with a small element isolation margin.

In one embodiment of the present invention, the interface element isolation region is a complex element isolation region comprising a deep element isolation with a depth deeper than the depth of the interface between the shallow well region and the deep well region and an approximately constant width and shallow element isolation regions disposed on both sides of the deep element isolation region and made of STI with a depth shallower than the depth of the interface.

According to the above embodiment, compared to the case of simply providing a deep element isolation region with a large width, embedment of an oxide film in the complex element isolation region is facilitated, and therefore it makes relatively easy to form a complex element isolation region with a large width. According to the complex element isolation region, effective isolation of the first conductive-type and the second conductive-type shallow well regions is implemented with a small element isolation margin, thereby enabling control of change in threshold values of a dynamic threshold transistor.

The present invention also provides a method for fabricating a semiconductor device having:

a semiconductor substrate;

a first conductive-type deep well region formed inside the semiconductor substrate;

a second conductive-type shallow well region formed in the first conductive-type deep well region;

a dynamic threshold transistor formed on the second conductive-type shallow well region, a gate electrode of the dynamic threshold transistor being short-circuited to the second conductive-type shallow well region;

a shallow element isolation region formed on the second conductive-type shallow well region and composed of STI with a depth shallower than a depth of an interface between the first conductive-type deep well region and the second conductive-type shallow well region; and a deep element isolation region formed on the first conductive-type deep well region by penetrating through the second conductive-type shallow well region and having an approximately constant width and a depth deeper than the depth of the interface between the first conductive-type deep well region and the second conductive-type shallow well region, the method comprising the steps of:
  forming a first film on a semiconductor substrate;
  forming a first open window on the first film;
  forming a first isolation trench by etching part of the semiconductor substrate with use of the first film as a mask;
  forming a second film on the first film and the first isolation trench;
  forming a second open window on the second film;
  etching part of the first film with use of the second film as a mask;
  forming a second isolation trench by partially etching the semiconductor substrate with use of the first film as a mask; and
  depositing an insulating film on the first film, the first isolation trench and the second isolation trench for filling the first isolation trench and the second isolation trench.

According to the invention, the first film functions as a mask for forming the first isolation trench and also as a mask for forming the second isolation trench. This makes it possible to decrease the steps for forming the semiconductor device. In addition, in forming the second isolation trench, the first isolation trench is etched together, which prevents generation of unnecessary difference in the first isolation trench.

In one embodiment of the present invention the first film is a laminated film made of a silicon oxide film and a silicon nitride film, the second film is a photoresist, and the insulating film is an oxide film.

According to the above embodiment, a laminated film resistant to ashing or hydrofluorination is used as the first film required to function as a mask twice. Meanwhile a film made of photoresist easily removable by ashing is used as the second film which should function as a mask only once. This may simplify the method for fabricating the semiconductor device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6A to 6E show examples of combinations of element isolation regions of the semiconductor element according to the first embodiment of the present invention;

DETAILED DESCRIPTION OF THE PREFERRED EMBODIMENTS

Hereinbelow, embodiments of the present invention will be described in detail with reference to accompanying drawings.

Material for a semiconductor substrate used in the present invention is not particularly limited, but silicon is rather preferable. The semiconductor substrate may have P-type or N-type conductivity.

Figure 1:
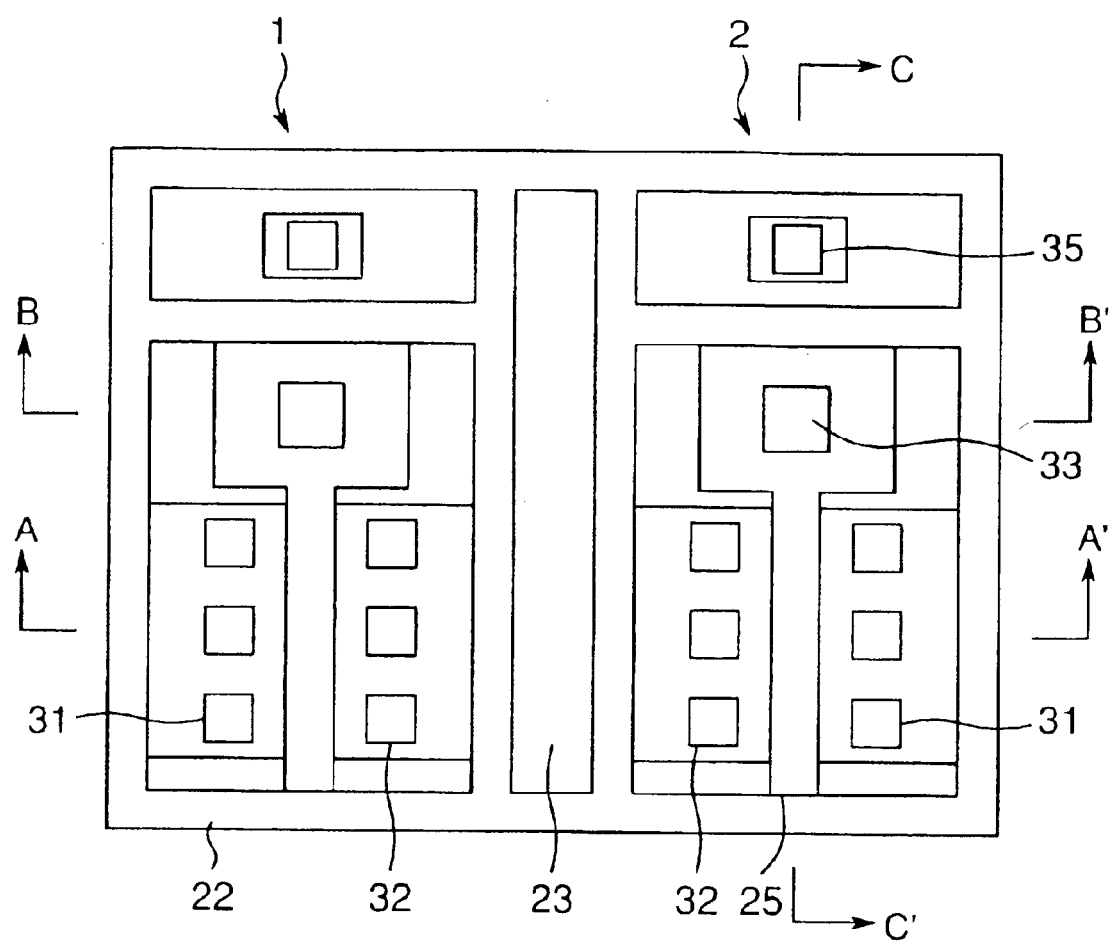
FIG. 1 is a plan view showing a semiconductor element according to a first embodiment of the present invention.
Figure 2:
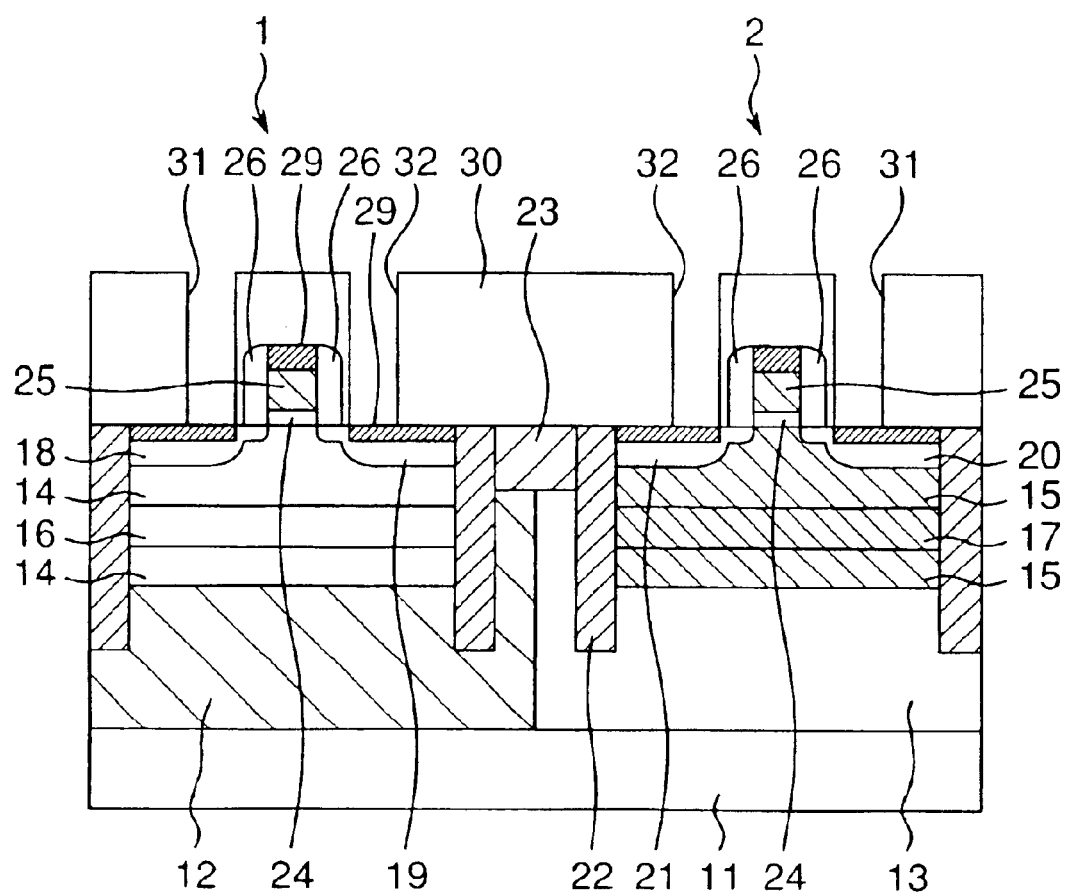
FIG. 2 is a cross sectional view taken along a section line A–A' of FIG. 1.
Figure 3:
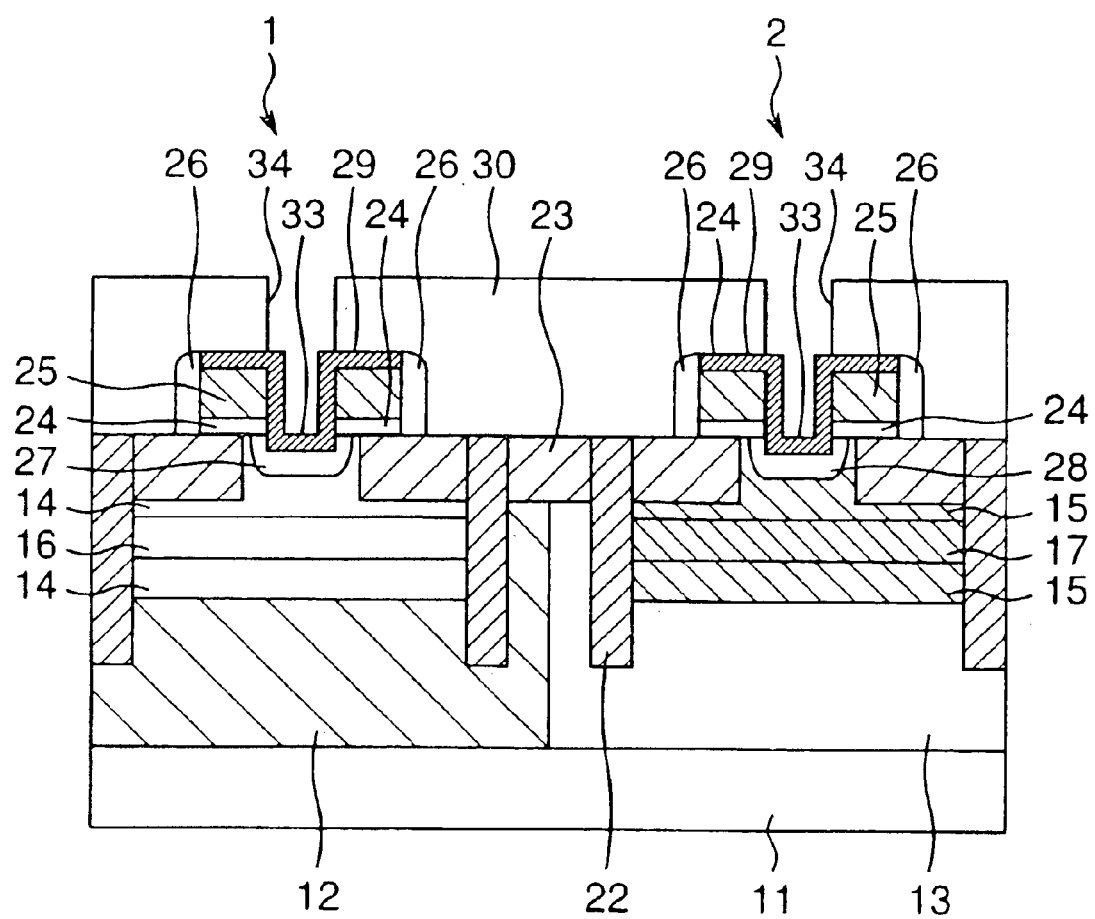
FIG. 3 is a cross sectional view taken along a section line B–B' of FIG. 1.
Figure 4:
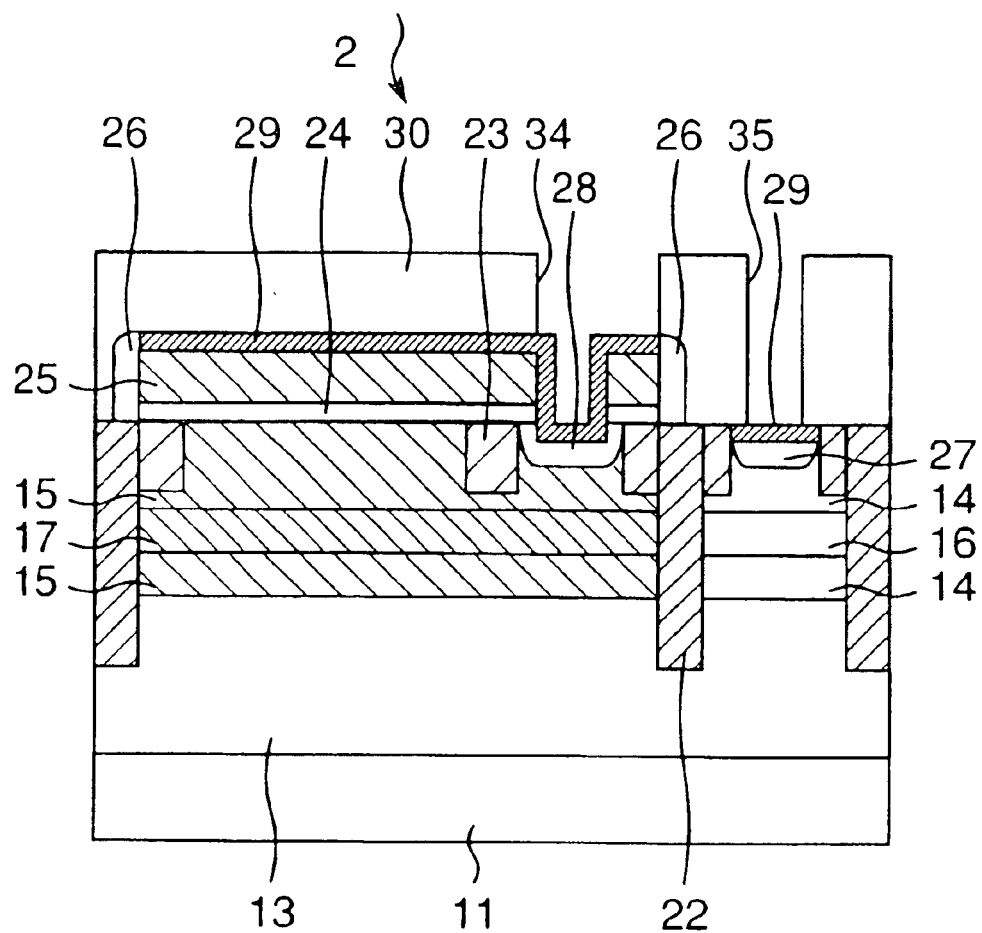
FIG. 4 is a cross sectional view taken along a section line C–C' of FIG. 1.

FIGS. 1 to 4 are schematic views of a semiconductor device according to a first embodiment of the present invention. FIG. 1 is a plan view of the semiconductor device. FIG. 2 is a cross sectional view taken along a section line A–A' of FIG. 1. FIG. 3 is a cross sectional view taken along a section line B–B' of FIG. 1. FIG. 4 is a cross sectional view taken along a section line C–C' of FIG. 1. It is noted that a silicided region, gate-side wall spacer, an interlayer insulating film, and an upper metal interconnection are omitted in FIG. 1, and the upper metal interconnection is omitted in FIGS. 2 to 4 FIGS. 1 to 3 show examples of combinations of one DTMOS 1 made of N-type MOSFET and one DTMOS 2 made of P-type MOSFET. The present invention, however, is not limited to the examples provided, and may include a plurality of N-type MOSFETs and a plurality of P-type MOSFETs. Further, the present invention may be structured with a single conductive-type MOSFET. FIG. 4 is a cross sectional view of P-type MOSFET, whose structure is identical to N-type MOSFET except that the conductive type of impurities is different.

As shown in FIG. 2, the semiconductor device in the first embodiment of the present invention has an N-type deep well region 12 and a P-type deep well region 13 formed inside a P-type semiconductor substrate 11.

Inside the N-type deep well region 12, a P-type shallow well region 14 is formed. In this P-type shallow well region 14, there is formed a P-type high-concentration embedding region 16 to reduce resistance of the P-type shallow well region 14. Though not shown in FIGS. 1 to 4, the P-type shallow well regions 14 of adjacent element, such as DTMOS are isolated from each other by a nonconductive deep element isolation region 22 with an approximately constant width (see FIG. 7B). In the P-type shallow well region 14, there are formed an N-type source region 18 and an N-type drain 19. On top of a channel region between the N-type source region 18 and the N-type drain 19, there is formed a gate electrode 25 through a gate insulating film 24. On a side wall of the gate electrode 25, a side-wall spacer 26 is formed. Thus, the N-type DTMOS 1 is structured.

Inside the P-type deep well region 13, an N-type shallow well region 15 is formed. In the N-type shallow well region 15, there is formed an N-type high-concentration embedding region 17 to reduce resistance of the N-type shallow well region 15. Though not shown in FIGS. 1 to 4, the N-type shallow well regions 15 of adjacent elements such as DTMOS 2 are isolated from each other by a nonconductive deep element isolation region 22 with an approximately constant width. In the N-type shallow well region 15, there are formed a P-type source region 20 and a P-type drain region 21. On top of a channel region between the P-type source region 20 and the P-type drain region 21, there is formed a gate electrode 25 through a gate insulating film 24. On a side wall of the gate electrode 25, a side-wall spacer 26 is formed. Thus, the P-type DTMOS 2 is structured.

The N-type source region 18 and the P-type source region 20 are each electrically connected to upper metal interconnections through a contact hole 31 formed in an interlayer insulating film 30. The N-type drain 19 and the P-type drain region 21 are each electrically connected to upper metal interconnections through a contact hole 32 formed in the interlayer insulating film 30.

As shown in FIGS. 1 and 3, the gate electrode 25 is provided with a gate-substrate connecting region 33. As shown in FIG. 3, in the shallow well regions 14 and 15 beneath the gate-substrate connecting region 33, there are formed a P-type highly concentrated impurities region 27 in the case of the N-type DTMOS 1 and an N-type highly concentrated impurities region 28 in the case of the P-type DTMOS 2, respectively. The gate electrodes 25, 25 are electrically connected to the shallow well regions 14, 15 through the gate-substrate connecting regions 33, 33 and the highly concentrated impurities regions 27, 28, respectively. Further, the gate electrode 25 is electrically connected to an upper metal interconnection (unshown) through a contact hole 34 formed in the interlayer insulating film 30.

As shown in FIG. 4, the P-type deep well region 13 is electrically connected to an upper metal interconnection through the P-type shallow well region 14, the highly concentrated impurities region 27 and a contact hole 35. Though not shown, the N-type deep well region 12 is electrically connected to an upper metal interconnection through the N-type shallow well region 15, the N-type highly concentrated impurities region 28, and the contact hole 35. Above each of the gate electrode 25, the N-type source region 18, the N-type drain region 19, the P-type source region 20, the P-type drain region 21, the P-type highly concentrated impurities region 27, and the N-type highly concentrated impurities region 28, there is formed a silicided region 29 to reduce contact resistance.

In the region except the channel region, the source regions 18 and 20, the drain regions 19 and 21, the gate-substrate connecting region 33, a region necessary for providing deep well contact, and the deep element isolation region 22 with an approximately constant width, there is formed a shallow trench-type element isolation region 23 made of STI for reducing electrostatic capacity.

Following description discusses procedures for fabricating the semiconductor device shown in FIGS. 1 to 4.

The steps for forming the element isolation regions 22 and 23 will be described with reference to FIGS. 5A to 5H and FIGS. 6A to 6E.

Figure 5A:
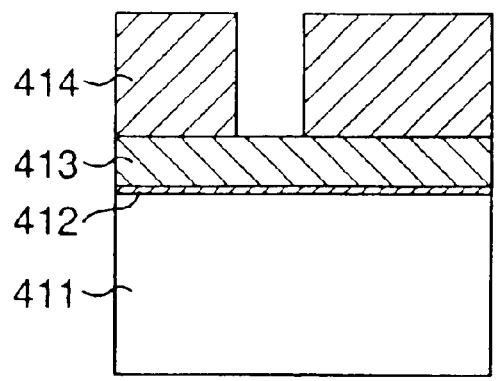
FIGS. 5A to 5H are schematic views showing procedures for forming an element isolation region of the semiconductor element according to the first embodiment of the present invention.
Figure 5D:
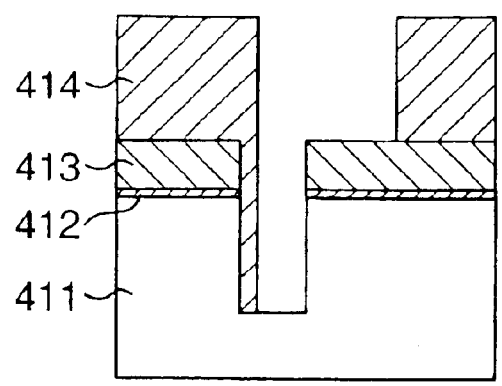
Figure 5B:
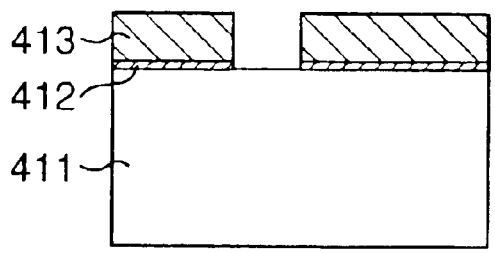
Figure 5E:
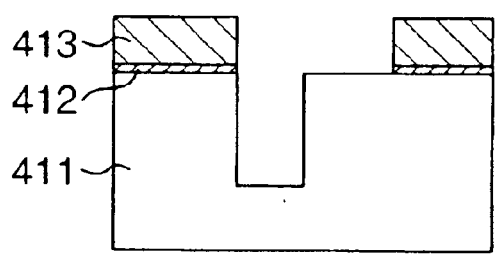
Figure 5C:
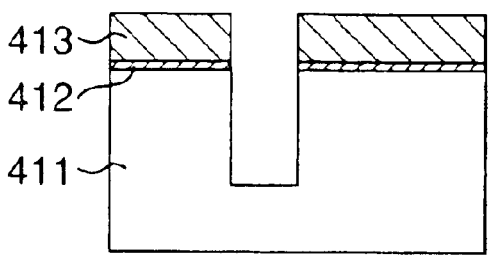
Figure 5F:
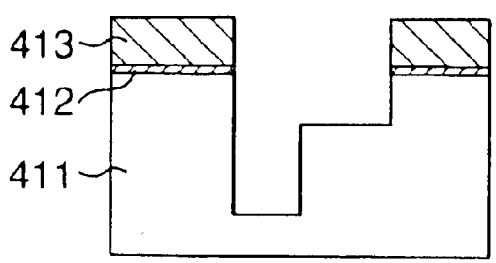
Figure 5G:
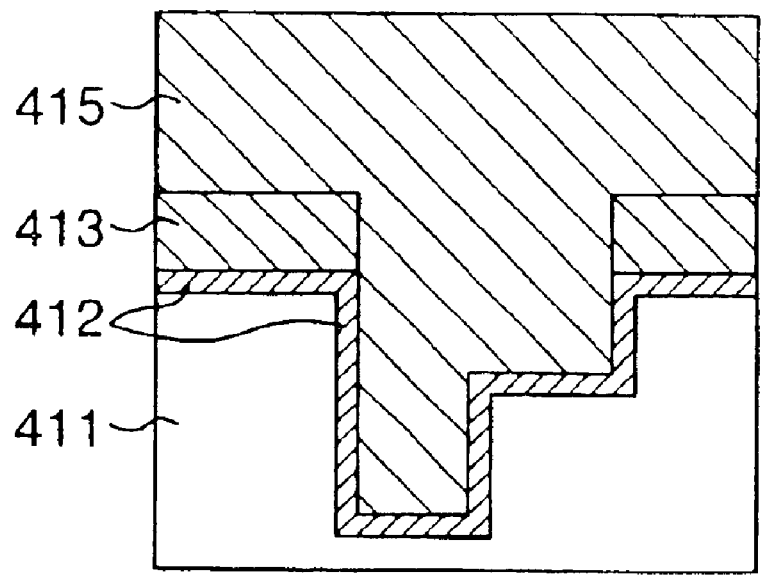
Figure 5H:
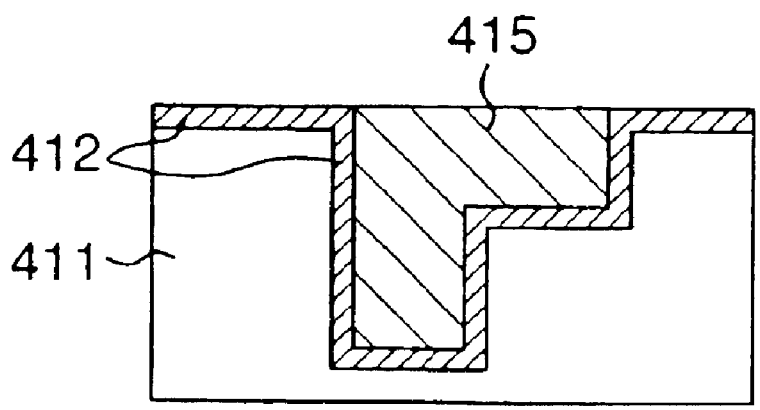

Firstly, as shown in FIG. 5A, on a semiconductor substrate 411 there is formed a film for use as a mask when forming an element isolation region. More particularly, an oxide film 412 is formed on the semiconductor substrate 411, on which a SiN film 413 is deposited by CVD (Chemical Vapor Deposition). The oxide film 412 functions both as a buffer film to prevent direct contact of the SiN film 413 and the semiconductor substrate 411 and as a protective coating when the SiN film is removed by phosphoric acid. Next as shown in FIGS. 5A and 5B, the oxide film 412 and the SiN film 413 undergo patterning conforming to the deep element isolation region 22 with a photoresist 414. With use of the photoresist 414 as a mask, part of the SiN film 413 and the oxide film 412 is removed by reactive ion etching (RIE), and then the photoresist 414 are removed. Then, as shown in FIG. 5C, using the SiN film 413 as a mask, part of the semiconductor substrate 411 is removed by RIE to form a trench. Next, as shown in FIGS. 5D and 5E, there is performed patterning conforming to the shallow element isolation region 23 with the photoresist 414. With use of the photoresist 414 as a mask, selective and partial removal of the SiN film 413 and the oxide film 412 is carried out by RIE, and then the photoresist 414 is removed. Next, as shown in FIG. 5F, with use of the SiN film 413 as a mask, part of the semiconductor substrate 411 is removed by RIE. At this stage, two kinds of trenches different in depth are formed in the semiconductor substrate. Here, thermal oxidation process is performed so that the side wall and the bottom of the element isolation region are oxidized to form an oxide film 412 shown in FIG. 5G. This imparts less defects to the interface between an insulator portion of the element isolation region and the semiconductor substrate, and improves electric characteristics of the element. Also, it is preferable to carry out a series of steps of thermal oxidation, oxide film removal and thermal oxidation instead of a single thermal oxidation step. This makes it possible to remove a portion carrying a number of crystal defects generated during the step of forming the element isolation regions and to make the interface between the insulator portion of the element isolation region and the semiconductor substrate less defective, thereby improving electric characteristics of the element. Next, as shown in FIG. 5G, a film 415 for filling the trench is formed by CVD. Materials of the trench-filling film 415 may include insulators such as oxide and silicon nitride films and conducting films such as amorphous silicon and polysilicon. It is noted that use of the conducting film as the trench-filling film 415 requires the following steps to secure insulation: 1) oxidizing the inner wall of the trench in advance; and 2) after filling the trench, oxidizing the upper side of the conducting film or placing an insulating cap thereon. Since the steps are simple and stress is small, the trench-filling film is preferably an oxide film 415. Formation of the oxide film 415 is preferably performed in two steps: a step performed under general conditions that help equal formation of the oxidation over the bottom surface and the side wall till a deep trench is filled; and a step performed under conditions that prevent the oxide from being formed on the side wall for filling a shallow trench (for example, use of a device employing HDP (High Density Plasma)). As a result, these trenches are filled with a thinner oxide, making it possible to control difference in film thickness in a later CMP (Chemical Machine Polishing) process. Next, by a known CMP techniques the oxide film 415 is polished and the SiN film 413 is removed, by which an element isolation region 415 is completed as shown in FIG. 5H.

In the above procedures, the SiN film 413 and the oxide film 412 function both as a mask for forming a deep trench and as a mask for forming a shallow trench, thereby simplifying the steps. In addition, in forming the shallow trench by etching, the deep trench formed before is etchers together, which prevents generation of unnecessary difference in the deep trench.

The shallow element isolation region and the deer, element isolation region may be formed alone or in combination.

FIGS. 6A to 6E show examples of element isolation regions, and FIGS. 7A to 7E show examples in which the element isolation regions are applied. In FIGS. 7A to 7E, component members equal to those in FIGS. 1 to 4 are designated by reference numerals equal to those in FIGS. 1 to 4, and their detailed descriptions are omitted.

FIG. 6A shows an example of forming a single shallow element isolation region made of STI. A depth HS of the shallow element isolation region may be set to such depth, for example 0.1 to 0.5 μm, that the source region and the drain region are isolated and shallow well regions are not isolated. A width of the shallow element isolation region WS1 should be set such that the source regions and the drain regions of adjacent elements can be electrically isolated with sufficiency. Therefore, it is preferable that the width of the shallow element isolation region WS1 is, for example, 0.05 μm or more. The type of the element isolation region shown in FIG. 6A is suitable for isolation of the elements which accept a shared shallow well region (general MOSFET in the same type) since it does not isolate the shallow well region (see FIG. 7A). This element isolation region is also provided in an interconnection portion of the gate electrode for decreasing electrostatic capacity between the gate region and the well region.

Figure 7A:
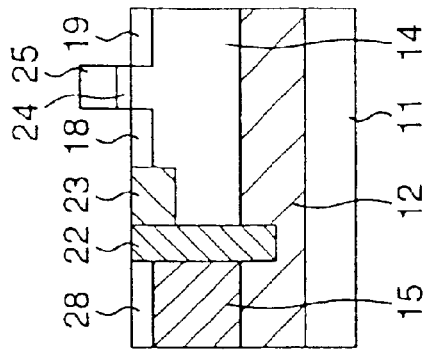
FIGS. 7A to 7E show application examples of the element isolation regions of FIGS. 6A to 6E.
Figure 7B:
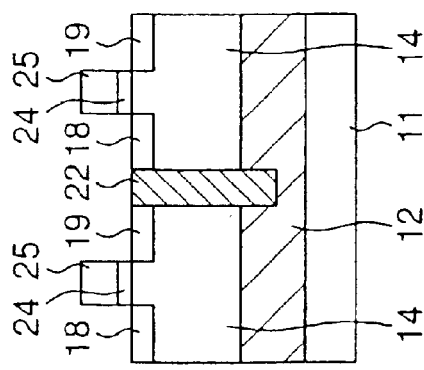

FIG. 6B shows an example of forming a single deep element isolation region. A depth of the deep element isolation region with an approximately constant width HD is preferably set to such depth that the shallow well region is electrically isolated, and the deep well region is not divided, that may be, for example, 0.3 to 2 μm. When a ratio of the depth HD and the width WD2 of the deep element isolation region i.e. HD/WD is very large, the ratio obstacles embedment of an oxide film. Therefore, the width WD2 of the deep element isolation region is set to, for example, 0.06 μm or more, and the ratio of the depth HD and the width WD2 of the deep element isolation region HD/WD2 is preferably set to 5 or less. The type of the element isolation region shown in FIG. 6B enables isolation of shallow well regions with a minimum element isolation width and therefore it is suitable for isolation of DTMOS of the same type (FIG. 7B).

Figure 7C:
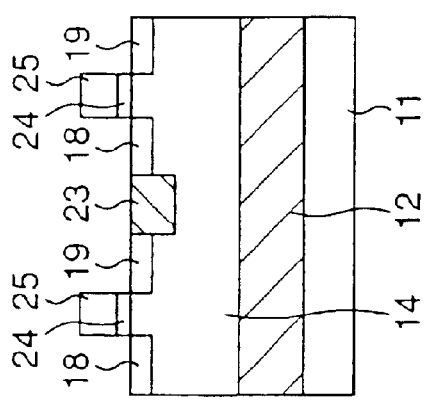

FIG. 6C shows an example of forming a complex element isolation region as an interface element isolation region, in which a shallow element isolation region made of STI is formed on one side of a deep element isolation, region with an approximately constant width. This type of the element isolation region is suitable for the case where the deep well region is shared while the shallow well regions separated by the element isolation region are different in conductive-type and MOSFET is present only on the side where the shallow element isolation region is provided (FIG. 7C) Such structure may be utilized, for example, in the case of providing a terminal for giving potential to a deep well region 12 as shown in FIG. 7C. Impurities forming a shallow well region 15 on the side where no MOSFET is present reach a MOSFET channel region due to spreading in horizontal direction at the time of injection and to dispersion by annealing, thereby triggering fluctuation of threshold values. In order to prevent the fluctuation of the threshold values, a shallow element isolation region 23 made of STI is provided on the side of MOSFET. On the side where no MOSFET is present, since slight fluctuation of impurities concentration exerts no influence, only the deep element isolation region 22 with an approximately constant width is provided and provision of the shallow element isolation region 23 is not necessary.

If only a wide and deep element isolation region is provided instead of the structure shown in FIG. 7C, embedment of an oxide become difficult. However, joint usage of the shallow element isolation region makes it relatively easy to form a wide element isolation region. Use of the structure of FIG. 6C achieves effective isolation of the shallow well region with a small element isolation margin, thereby enabling control of change in MOSFET threshold values.

Figure 7D:
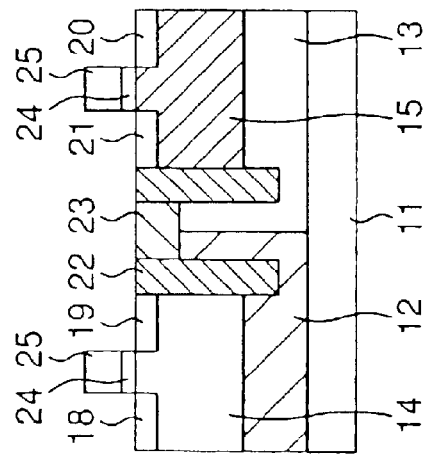

FIG. 6D shows a complex element isolation region composed of a shallow element isolation region made of STI formed on both sides of a deep element isolation region with an approximately constant width. This type of the complex element isolation region is suitable for the case where the deep well region is shared while the shallow well regions separated by the element isolation region are different in conductive-type and MOSFET is present on both sides (FIG. 7D). Such structure may be utilized, for example, as an interface element isolation region that is a complex element isolation region composed of a deep element isolation region 22 and a shallow element isolation region 23 in the interface between the N-type DTMOS and P-type normal MOSFET as shown in FIG. 7D. Without the shallow element isolation region 23, impurities forming the shallow well regions 14 and 15 would reach their opposite conductive-type shallow well regions 15 and 14, thereby causing fluctuation of MOSFET threshold values. However the complex element isolation region has the shallow element isolation region 23, so that dispersion of the impurities is avoided, thereby preventing fluctuation of the threshold values. Without the deep element isolation region 22, the N-type shallow well region 15 and the N-type drain region 19 for example would be likely to cause punchthrough. However, the complex element isolation region has the deep element isolation region 22, the punchthrough may be effectively prevented.

If only a wide and deep element isolation region is provided, embedment of an oxide in a wide trench become difficult. However, in the complex element isolation region composed of the shallow element isolation region made of STI formed on both sides of the deep element isolation region with an approximately constant width shown in FIG. 6D, joint usage of the shallow element isolation region makes it relatively easy to form a wide element isolation region. Use of the structure of FIG. 6D achieves effective isolation of the shallow well region with a small element isolation margin, thereby enabling control of change in MOSFET threshold values.

Figure 7E:
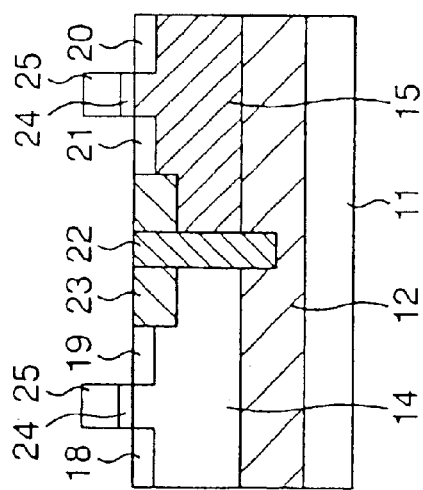

FIG. 6E shows a complex element isolation region composed of deep element isolation regions with an approximately constant width formed on both sides of a shallow element isolation region made of STI. This type of the complex element isolation region is suitable for use as an interface element isolation region having deep well regions different in conductive-type disposed on both sides thereof (FIG. 7E). Such structure is suitable for isolating, for example, the N-type DTMOS and the P-type DTMOS.

If only a wide and deep element isolation region is provided instead of the complex element isolation region shown in FIG. 6E, embedment of an oxide film in the wide trench become difficult. However, joint usage of the deep element isolation region with an approximately constant width and the shallow element isolation region makes it relatively easy to form a wide element isolation region. Use of the structure of FIG. 6E enables effective prevention of punchthrough between the N-type deep well region 12 and the N-type shallow well region 15 or between the P-type deep well region 13 and the P-type shallow well region 14 because of the presence of the deep element isolation regions 22 on both sides of the shallow element isolation region 23 as shown in FIG. 7E. This achieves effective isolation of a basic circuit block made of N-type DTMOS and a basic circuit block made of P-type DTMOS with a small element isolation margin.

Next, as shown in FIGS. 2 and 3, an N-type deep well region 12 and a P-type deep well region 13 are formed on a semiconductor substrate 11. Examples of impurity ions to impair N type include $^{31}P^+$ while examples of impurity ions to impair P type include $^{11}B^+$. The deep well region may be formed with injection energy of 240 to 1500 KeV and injection quantity of $5 \times 10^{11}$ to $1 \times 10^{14}$ cm$^{-2}$ in the case of using $^{21}P^+$ as the impurity ions, or with injection energy of 100 to 1000 Kev and injection quantity of $5 \times 10^{11}$ to $1 \times 10^{14}$ cm$^{-2}$ in the case of using $^{11}B^+$ as the impurity ions.

In a shallow region seen from the top face of the substrate on a first conductive-type deep well region there is formed a second conductive-type shallow well region or a first conductive-type shallow well region. In the area where the second conductive-type shallow well region is formed, the second conductive-type shallow well region is surrounded by the first conductive-type deep well region, so that DTMOS can be formed there. In the area where the first conductive-type shallow well region is formed, the first conductive-type shallow well region is integrated with the first conductive-type deep well region, so that a contact region of the deep well region can be formed there.

More particularly, as shown in FIGS. 2, 3, and 4 a P-type shallow well region 14 is formed on an N-type deep well region 12, while an N-type shallow well region 15 and a P-type shallow well region 14 are formed on a P-type deep well region 13. Examples of impurity ions to impair P type include $^{11}B^+$ while examples of impurity ions to impair N type include $^{31}P^+$. The shallow well regions 14 and 15 may be formed with injection energy of 60 to 500 KeV and injection quantity of $5 \times 10^{11}$ to $1 \times 10^{14}$ cm$^{-2}$ in the case of using $^{11}B^-$ as the impurity ions, or with injection energy of 130 to 900 Kev and injection quantity of $5 \times 10^{11}$ to $1 \times 10^{14}$ cm$^{-2}$ in the case of using $^{31}P^+$ as the impurity ions. It is noted that a depth of interface between the shallow well regions 14 and 15 and the deep well regions 12 and 13 is determined by injection conditions of the shallow well regions 14 and 15, injection conditions of the deep well regions 12 and 13, and a later thermal process performed under these conditions. A depth of the deep element isolation region 22 is set such that the shallow well regions 14 and 15 of adjacent elements would be electrically isolated. More particularly, the lower end of the deep element isolation region 22 is set to be deeper than the depth of interface between the deep well regions 12 and 13 and the shallow well regions 14 and 15.

Further, for reduction of resistance of the shallow well regions 14 and 15, a P-type high-concentration embedding region 16 and an N-type high-concentration embedding region 17 are formed in the shallow well regions 14 and 15. Reduced resistance of the shallow well regions 14 and 15 enables swift transmittance of an input to a gate electrode 15 to the shallow well regions 14 and 15, obtainment of sufficient substrate bias effect, and speed-up operation of the element. The high-concentration embedding regions 16 and 17 may be formed, for example. In the P-type shallow well region 14 with impurity ions of $^{11}B^+$, injection energy of 100 to 400 KeV and injection quantity of $1 \times 10^{12}$ to $1 \times 10^{14}$ cm$^{-2}$, or in the N-type shallow well region 15 with impurity ions of $^{31}P^+$, injection energy of 240 to 750 Kev and injection quantity of $1 \times 10^{12}$ to $1 \times 10^{14}$ cm$^{-2}$. According to circumstances, the high-concentration embedding regions 16 and 17 may be omitted.

Further, to prevent the impurity concentration on the surface region of the substrate from being too low, there may be performed punchthrough stopper injection of impurity ions of the same conductive-type as that of the impurity ions in the shallow well regions 14 and 15 into the shallow well regions 14 and 15. The punchthrough stopper injection may be performed in the case of the P-type shallow well region 14 with impurity ions of $^{11}B^+$, injection energy of 10 to 60 KeV and injection quantity of $5 \times 10^{11}$ to $1 \times 10^{13}$ cm$^{-2}$, or in the case of the N-type shallots well region 15 with impurity ions of $^{31}P^+$, injection energy of 30 to 150 Kev and injection quantity of $5 \times 10^{11}$ to $1 \times 10^{13}$ cm$^{-2}$.

Next, an insulating film 24 and a gate electrode 25 are formed in this order.

Materials of the insulating film 24 are not specifically limited as long as they have the insulating property. If silicon substrates are used, silicon oxide films, silicon nitride films, or laminated products thereof are applicable. Other applicable materials include high-dielectric films such as aluminum oxide films, titanium oxide films, and tantalite films or laminated products thereof. In the case of using a silicon oxide film, the insulating film 24 is preferable to have a thickness of 1 to 10 nm. The gate insulating film can be formed by such methods as CVD, sputtering, and thermal oxidation.

Materials of the gate electrode 25 are not particularly restricted as long as they have the conductive property. If silicon substrates are used, the gate electrode 25 is made of silicon films such as polysilicon and single crystal silicon. Other metal films made of aluminum or copper may be used. The gate electrode 25 is preferable to have a thickness of 0.1 to 0.4 μm. The gate electrode 25 can be formed by such a method as CVC or evaporation.

Further, a side-wall spacer 26 is formed on a side wall of the gate electrode 25. Though materials of the side-wall spacer 26 are not specifically restricted, but they include oxide silicon and silicon nitride. According to circumstances, the side-wall spacer 26 may be omitted.

Next, in order to form a gate-substrate connecting region 33 for electrically connecting the gate electrode 25 and the shallow well regions 14 and 15 as shown in FIGS. 1 and 3 in the region except the source region 18 and 20 shown in FIG. 2, the drain regions 19 and 21, and the channel region, parts of the gate electrode 25 and the insulating film 24 are etched till the ground substrate is exposed. In this exposed region, as shown in FIG. 3, there is formed a region with high impurity concentration (a P-type highly concentrated impurities region 27 in the case of NMOS and an N-type highly concentrated impurities region 28 in the case of PMOS). Later-performed silicide formation process provides electrical connection between the gate electrode 25 and the shallow well regions at the gate-substrate connecting region 33.

Next, as shown in FIG. 2, on the surface layer of the shallow well regions 14 and 15, there are formed a source region (a source region 18 of NMOS 1 and a source region 20 of PMOS 2) and a drain region (a drain region 19 of NMOS 1 and a drain region 21 of PMOS 2) whose conductive types are contrary to those of the shallow well regions 14 and 15.

The source regions 18 and 20 and the drain regions 19 and 21 may be formed, for example, in a self-aligned manner through injection of impurity ions whose conductive types are contrary to those of the shallow well regions 14 and 15 with use of the gate electrode 25 as a mask. The source regions 18 and 20 and the drain regions 19 and 21 may be formed with injection energy of 3 to 100 KeV and injection quantity of $1\times10^{15}$ to $1\times10^{16}$ cm$^{-2}$ in the case of using $^{75}$As$^{+}$ ions as the impurity ions, or with injection energy of 1 to 20 Kev and injection quantity of $1\times10^{15}$ to $1\times10^{16}$ cm$^{-2}$ in the case of using $^{11}$B$^{+}$ ions as the impurity ions. It is noted that the surface layer of the shallow well regions 14 and 15 beneath the gate electrode 25 functions as a channel region.

Further, the source regions 18 and 20 and the drain regions 19 and 21 have an LDD (Lightly Doped Drain) region on the side of the gate electrode 25. The LDD region may be formed in a self-aligned manner through, for example, injection of impurity ions whose conductive types are contrary to those of the shallow well regions 14 and 15 with use of the gate electrode 25 as a mask. In this case after the LDD region is formed and the side-wall spacer 26 is formed on the side wall of the gate electrode 25, the source regions 18 and 20 and the drain regions 19 and 21 may be formed in a self-aligned manner through ion injection with use of the gate electrode 25 and the sides wall spacer 26 as masks. Injection of impurity ions for forming the LDD region may be performed with injection energy of 3 to 100 KeV and injection quantity of $5\times10^{13}$ to $1\times10^{15}$ cm$^{-2}$ in the case of using $^{75}$As$^{+}$ ions as the impurity ions, or with injection energy of 1 to 20 Kev and injection quantity of $1\times10^{13}$ to $5\times10^{14}$ cm$^{-2}$ in the case of using $^{11}$Bp$^{+}$ ions as the impurity ions.

Other ions applicable as the impurity ions for forming the source regions 18 and 20, the drain regions 19 and 21, and the LDD region include $^{31}$P$^{+}$ ions, $^{122}$Sb$^{+}$ ions, $^{115}$In$^{+}$ ions, and $^{49}$BF$_{2}^{+}$ ions in addition to the above-stated $^{115}$B$^{+}$ ions and $^{75}$As$^{+}$ ions.

For decreasing resistance of the source regions 18 and 20, the drain regions 19 and 21, and the gate electrode 25 and for improving their conductivity to interconnections connected thereto, the surface layers thereof are silicided. This silicide process provides electrical connection between the gate electrode 25 and the shallow well regions 14 and 15 through a silicided region 29 at the gate-substrate connecting region 33 as shown in FIG. 3. Materials of the silicided region 29 include tungsten silicide and titanium silicide.

After that, activation annealing of impurities is performed under conditions that provide full activation of impurities without causing excessive dispersion thereof. For example, in the case where N-type impurities are $^{75}$As$^{+}$ and P-type impurities are $^{11}$B$^{+}$, $^{75}$As$^{+}$ is injected and then annealing at 800 to 1000° C. is performed for about 10 to 100 minutes, after which $^{11}$B$^{+}$ is injected and annealing at 800 to 1000° C. is performed for about 10 to 100 minutes. For smoothing impurity profiles of the shallow well regions 14 and 15 and the deep well regions 12 and 13, extra annealing may be applied before the impurities of the source regions 18 and 20 and the drain regions 19 and 21 are injected.

Thereafter, interconnections and so on are formed by known methods, by which a semiconductor device is fabricated.

It is noted that although the above description discussed the case where one N-type DTMOS 1 and one P-type DTMOS 2 are disposed for convenience of description, the case where a plurality of each element are formed on the substrate shall be also embraced in the scope of the present invention. Further, not only DTMOS but also normally-structured MOSFET may exist together. In such a case, an element to be a normal MOSFET is not provided with a gate-substrate connecting region 33 but provided with a contact region for securing potential of the shallow well region.

Figure 12:
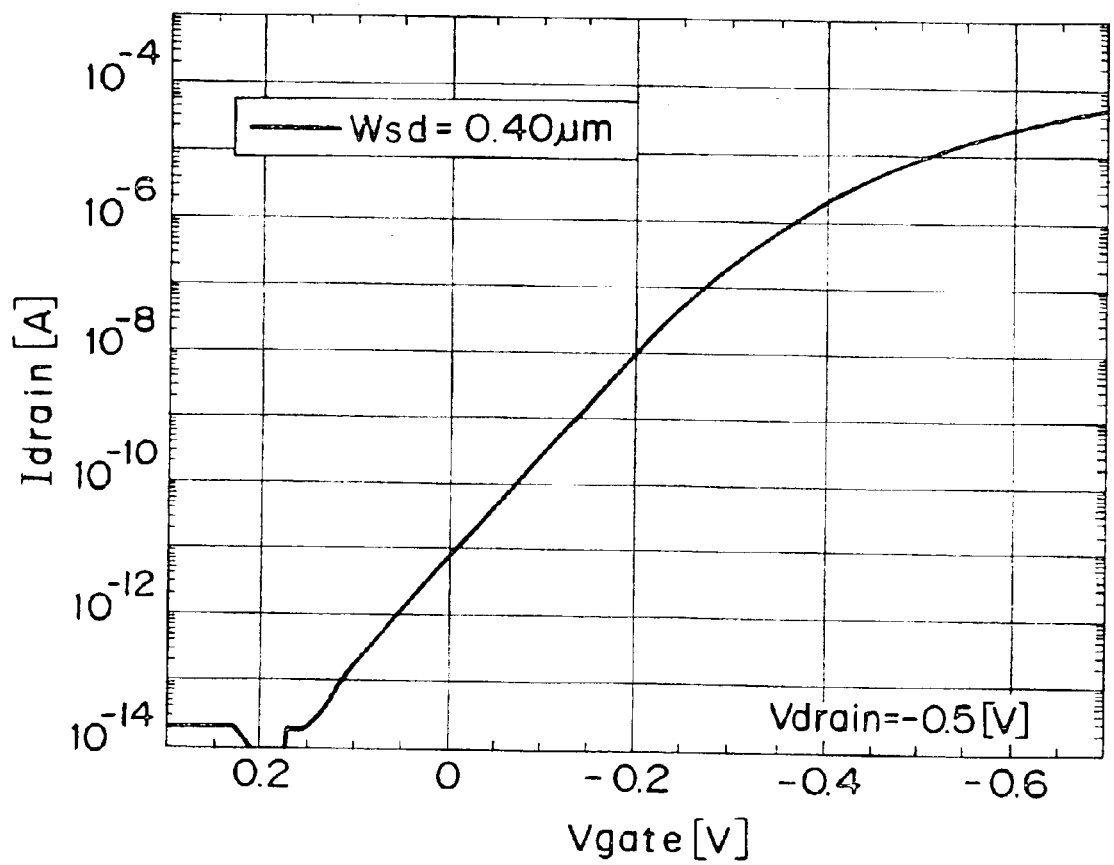
FIG. 12 is a graph showing characteristics of drain current versus gate voltage in the semiconductor element according to the embodiments of the present invention.
Figure 13:
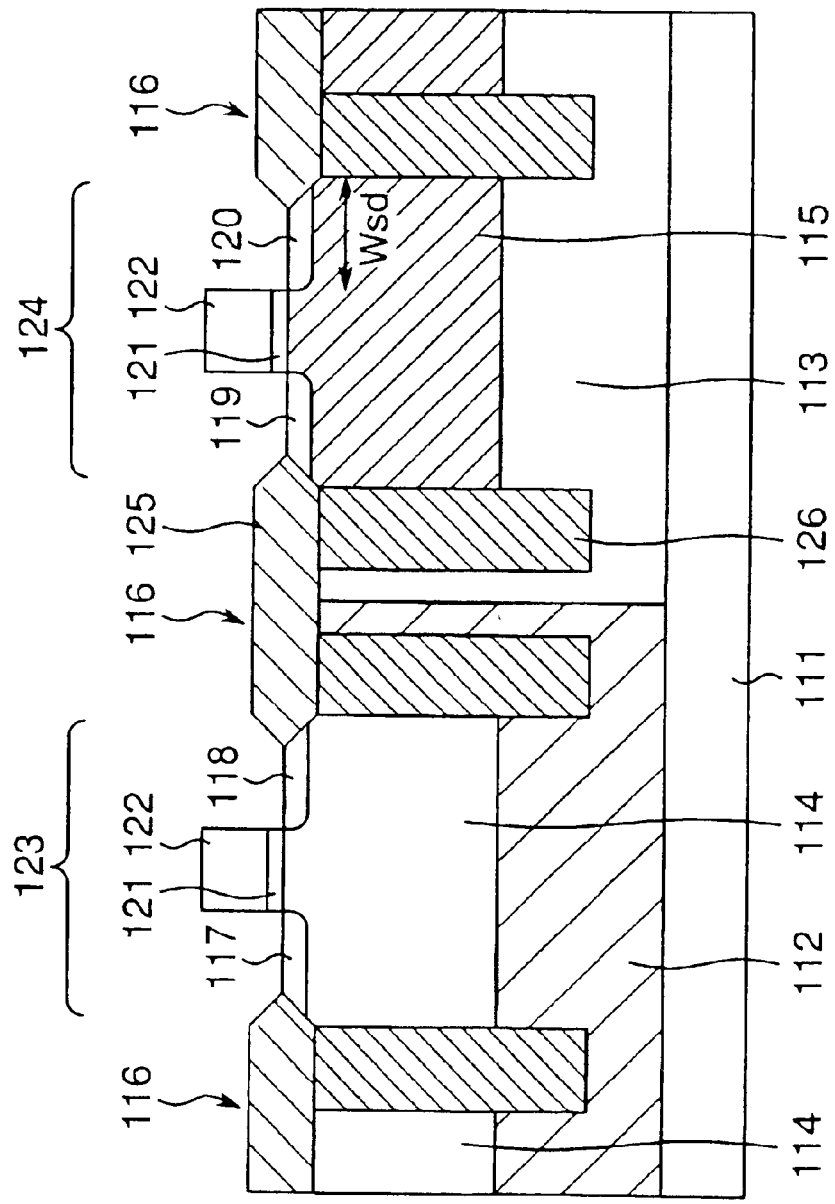
FIG. 13 is a cross sectional view showing a prior art semiconductor element.
Figure 14:
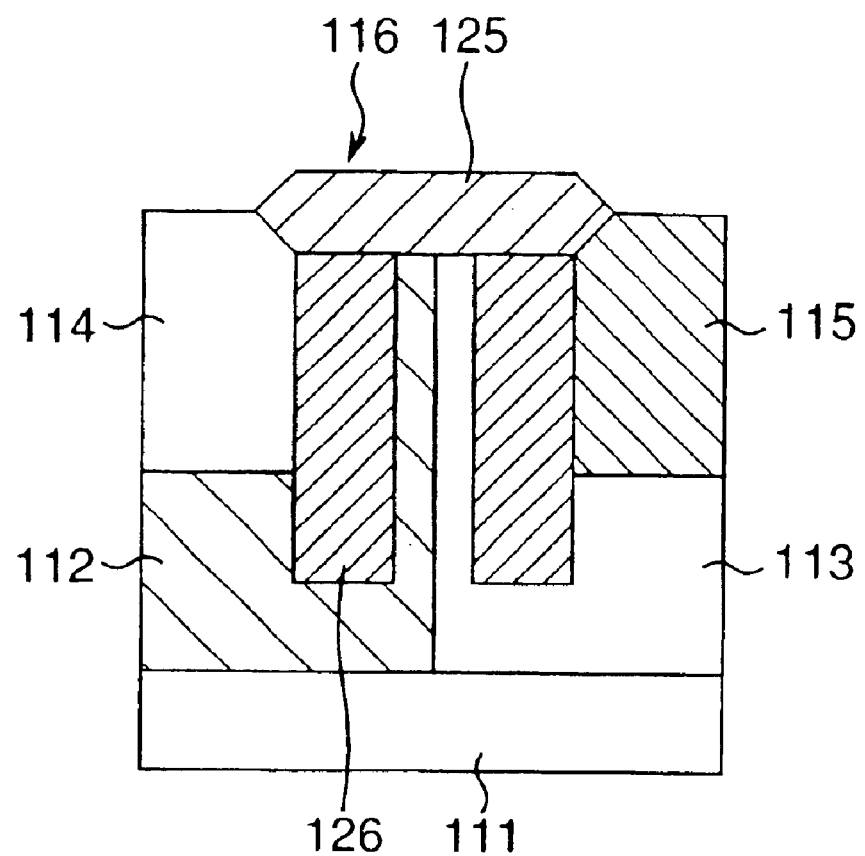
FIG. 14 is a detail view showing the element isolation region of FIG. 13.
Figure 15:
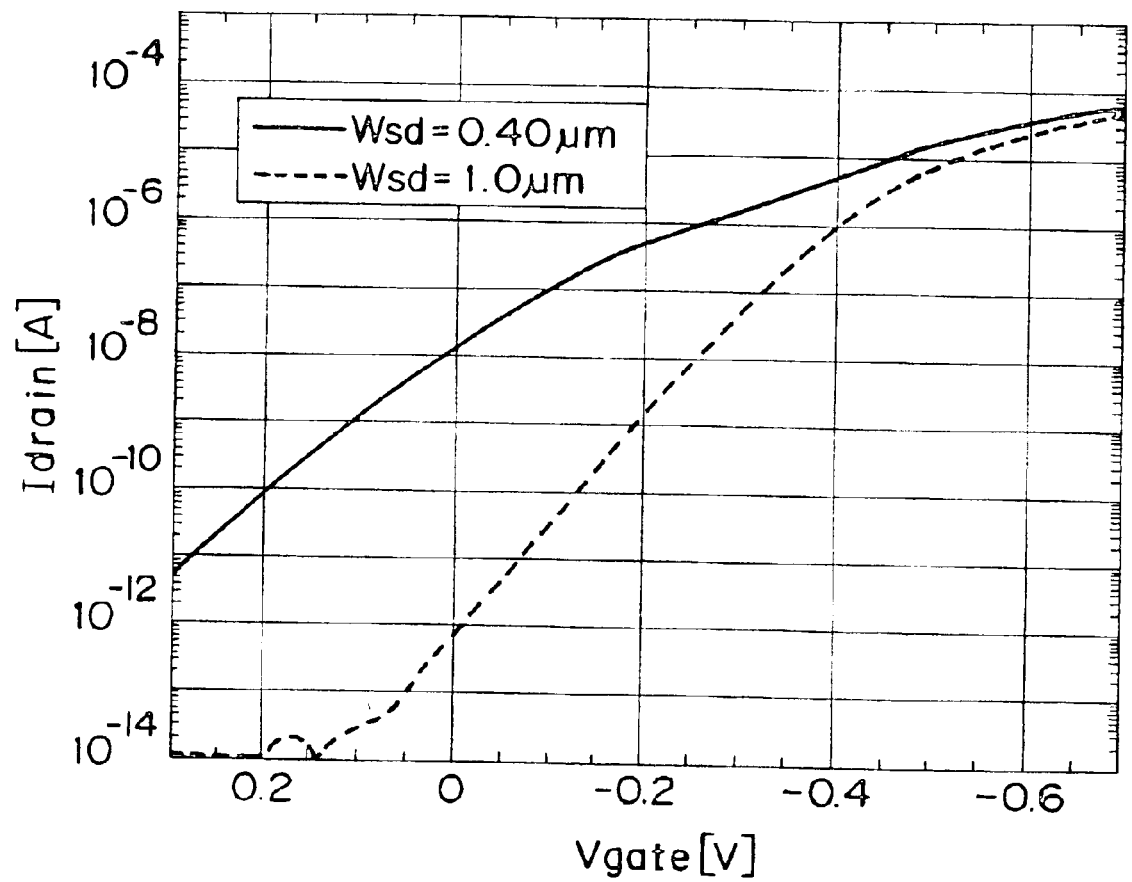
FIG. 15 is a graph showing characteristics of drain current versus gate voltage in the semiconductor element according to the prior art.

FIG. 12 shows change of drain current versus gate voltage in the P-type DTMOS 2 according to the first embodiment, in which Wsd equals 0.40 μm (Wsd refers to a distance from the end of the gate electrode to the element isolation region). It is found that off leakage of the P-type DTMOS 2 in the first embodiment is well controlled compared to off leakage of the prior art shown in FIG. 15.

The semiconductor device is provided with both a deep element isolation region 22 with an approximately constant width and a shallow element isolation region 23 made of STI as the element isolation region, and the shallow element isolation region 23 is free from remarkable bird's beak like LOCOS oxide. This enables prevention of off leakage failure of PMOS 2 due to stress caused by bird's beak, and minimizes margin between elements or inter-elements.

According to the first embodiment, there is provided integrated circuits that are free from off leakage failure of PMOS and include DTMOS 2 enabling high integration.

A semiconductor device according to a second embodiment of the present invention will be described with reference to schematic views shown in FIGS. 8 to 11.

Figure 8:
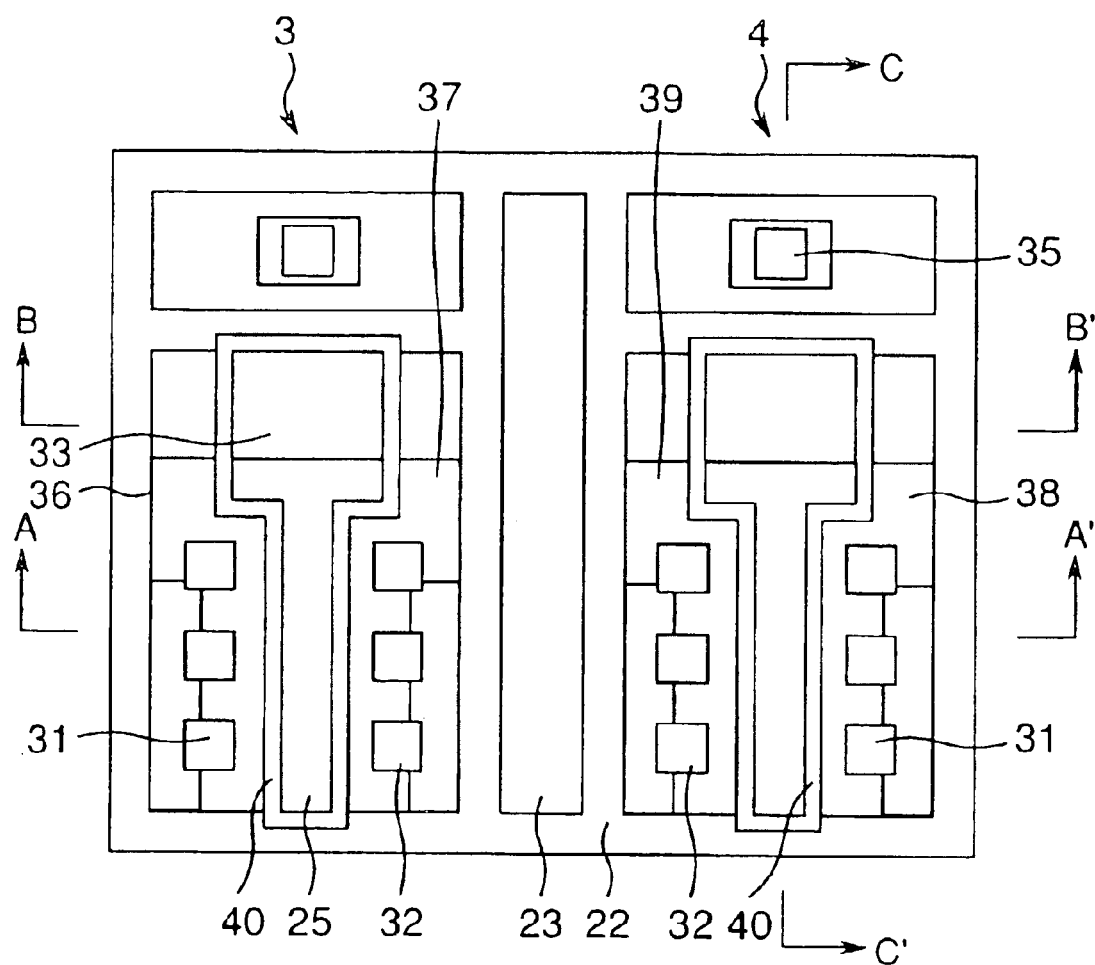
FIG. 8 is a plan view showing a semiconductor element according to a second embodiment of the present invention.
Figure 9:
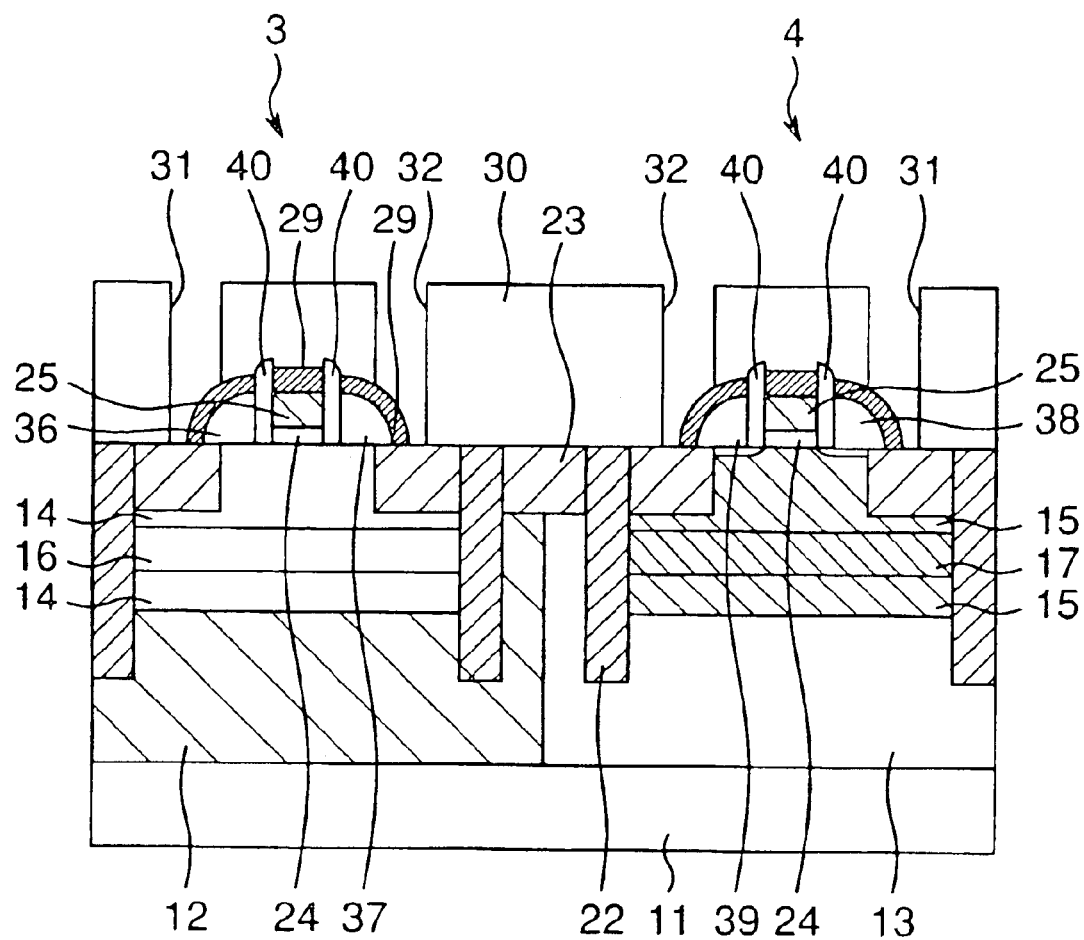
FIG. 9 is a cross sectional view taken along a section line A–A' of FIG. 8.
Figure 10:
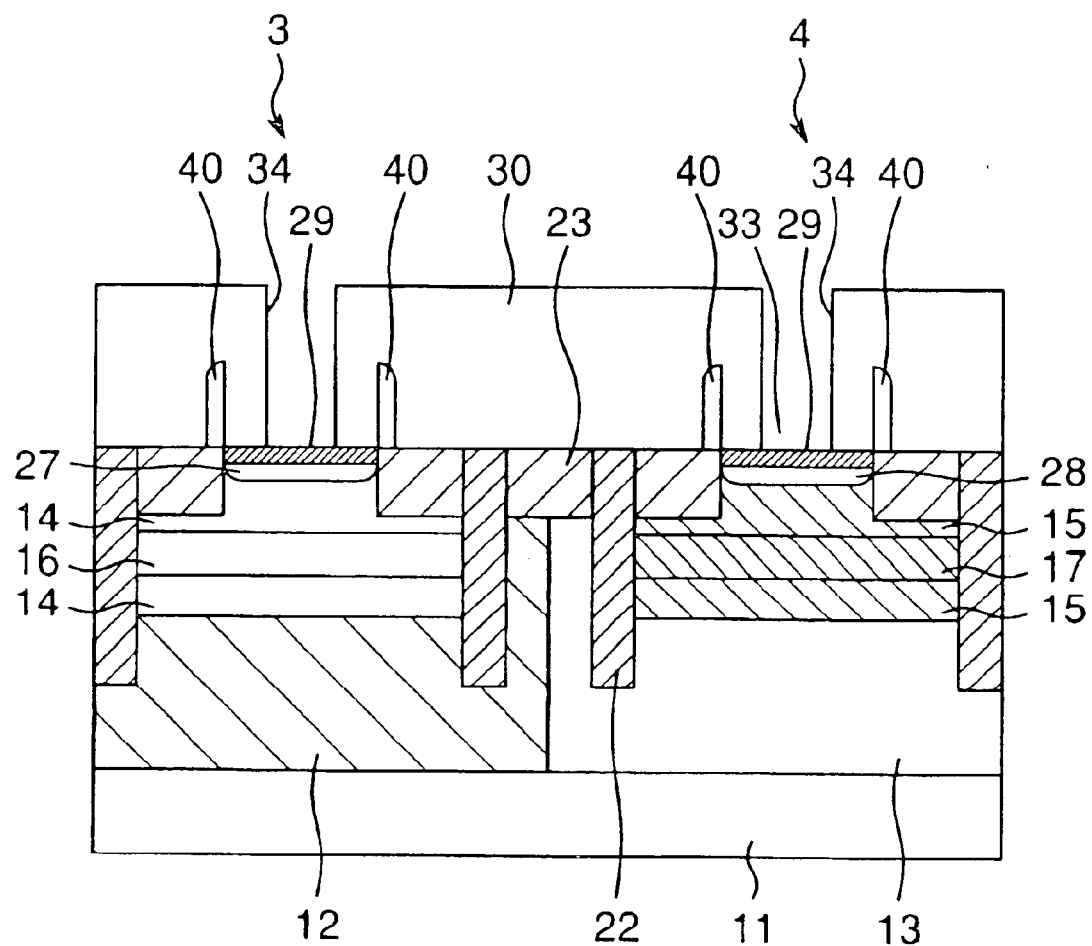
FIG. 10 is a cross sectional view taken along a section line B–B' of FIG. 8.
Figure 11:
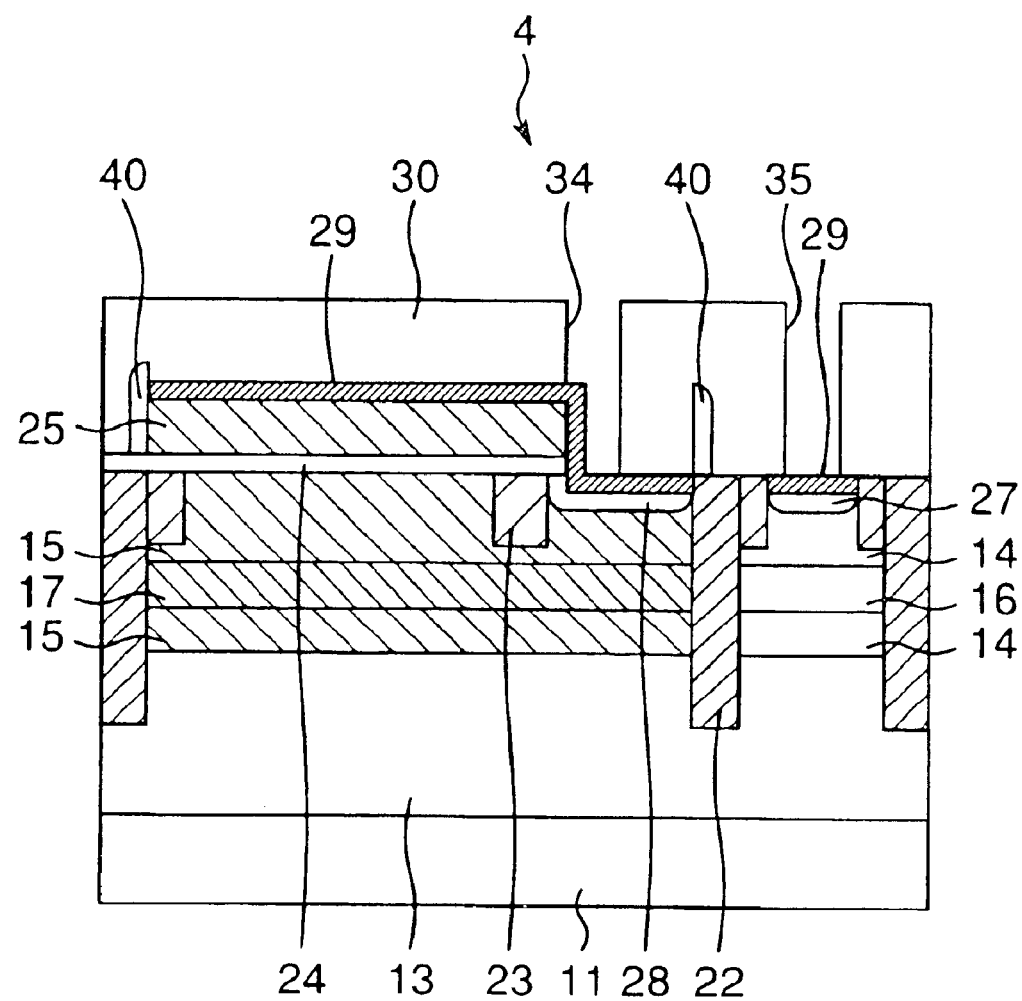
FIG. 11 is a cross sectional view taken along a section line C–C' of FIG. 8.

FIG. 8 is a plan view of the semiconductor device. FIG. 9 is a cross sectional view taken along a section line A–A' of FIG. 8. FIG. 10 is a cross sectional view taken along a section line B–B' of FIG. 8. FIG. 11 is a cross sectional view taken along a section line C—C or FIG. 8. It is noted that a silicided regions an interlayer insulating film, and an upper metal interconnection are omitted in FIG. 8, and that the upper metal interconnection is omitted in FIGS. 9 to 11. FIGS. 8 to 11 show combinations of one N-type MOSFET 3 and one P-type MOSFET 4. However, the present invention is not limited to the above-stated combinations, and may include a plurality of N-type MOSFETs and a plurality of P-type MOSFETs. Further, the present invention may be structured with a single conductive-type MOSFET. FIG. 11 is a cross sectional view of P-type MOSFET 4, whose structure is identical to N-type MOSFET except that the conductive type of impurities is different.

The semiconductor device of the second embodiment is different from the semiconductor device of the first embodiment in the point that source regions 36 and 38 and drain regions 37 and 39 are a stacked-up type. The fabrication procedure of the semiconductor device will be described below.

The same fabricating procedure as that in the first embodiment is applied to the semiconductor device of the second embodiment till the gate electrode 25 is formed Next, as shown in FIG. 9, on a side wall of the gate electrode 25, a nonconductive side-wail spacer 40 is formed. As the nonconductive side-wall spacer 40, such materials as silicon nitride and silicon oxide are usable. Further, on a side wall of the nonconductive side-wall spacer 40, there is formed a conductive side-wall spacers part of which will afterwards form the source regions 36 and 38 and the drain regions 37 and 39. Both polysilicon and amorphous silicon may be used for the conductive side-wall spacer, but polysilicon is more preferable than amorphous silicon. The conductive side-wall spacer is electrically insulated from the gate electrode 25 by the nonconductive side-wall spacer 40. At this point, the conductive side-wall spacer surrounds the gate electrode 25 annularly.

Next, two parts of the conductive side-wall spacer are removed by etching with use of a resist mask (not shown). Further, for formation of the source regions 36 and 38 and the drain regions 37 and 39, ion injection is made to the conductive side-wall spacer, and annealing is performed for activation of impurities. Consequently, there are formed an N-type stacked-up type source region 36; an N-type stacked-up type drain region 37, a P-type stacked-up type source region 38 and a P-type stacked-up type drain region 39. Ion injection for the source regions 36 and 38 and the drain regions 37 and 39 may be performed, for example, with injection energy of 10 to 180 KeV and injection quantity of $1\times10^{15}$ to $2\times10^{16}$ cm$^{-2}$ in the case our using $^{75}$As$^+$ as the impurity ions, with injection energy of 5 to 100 KeV and injection quantity of $1\times10^{15}$ to $2\times10^{16}$ cm$^{-2}$ ion the case of using $^{31}$P$^+$ as the impurity ions, or with injection energy of 5 to 40 Kev and injection quantity of $1\times10^{15}$ to $2\times10^{16}$ cm$^{-2}$ in the case of using $^{11}$B$^+$ ions as the impurity ions.

Etching of the conductive side-wall spacer stated above also removes part of the gate electrode 25 and the insulating film 24 below, which generates an exposed region of the shallow well regions 14 and 15 (gate-substrate connecting region 33). Impurity ions are injected into this gate-substrate connecting region 33 for formation of the source regions 36 and 38 and the drain regions 37 and 39. This forms a concentrated impurities region (a P-type highly concentrated impurities region 27 in the case of the NMOS 3 and an N-type highly concentrated impurities region 28 in the case of the PMOS 4).

Next, silicide process is performed so as to achieve ohmic connection between the gate electrode 25 and the shallow well regions 14 and 15 through a silicide 29. Then, interconnection is made in the same procedure as that for the semiconductor device of the first embodiment.

By the above steps, there are formed the N-type DTMOS 3 and the P-type DTMOS 4.

It is noted that although the above description discussed the case where one NMOS DTMOS 3 and one PMOS DTMOS 4 are formed for convenience of description, the case where a plurality of elements are formed on the substrate shall be also included in the scope of the present invention. Further, not only DTMOS but also normally-structured MOSFET may exist together. In such a case, an element to be a normal MOSFET is not provided with a gate-substrate connecting region 33 but provided with a contact region for securing potential of the shallow well region As described above, forming the source regions 36 and 38 and the drain regions 37 and 39 in a stacked-up type makes it easy to decrease the depth of interface of the source regions 36 and 38 and the drain regions 37 and 39 with the shallow well regions 14 and 15. This is because dispersion speed of impurities in the stacked-up layer (conductive gate-side wall spacer) is larger than that in the substrate. This effect is remarkable when the stacked-up layer is made of polysilicon. This facilitates formation of elements with small short-channel effect, and enables considerable area reduction of the source regions 36 and 38 and the drain regions 37 and 39.

For example, in the normal MOSFET, the widths of the source region and the drain region should be three times a minimum processing size for allowing a margin for contact formation. In the case of forming the source region and the drain region in a stacked-up type, the width thereof may be decreased to about two third of the minimum processing size because of the following reasons.

(1) In the normally-structured source region and the drain region, if the contact hole invades an element isolation region, the element isolation region is cut off. As a consequence, an interface of the source region or the drain region with the well region is exposed, which causes leakage current. Therefore, it is necessary to secure enough margin so as for the contact hole not to be away from the source region and the drain region. In the case of the stacked-up type source regions 36 and 38 and the drain regions 37 and 39, even if the contact hole 31, 32 cut off the element isolation region 23, the interface of the source region 36, 38 or the drain region 37, 39 with the well regions 14, 15 is not exposed. Therefore, the leakage current problem is not generated.

(2) Forming the source regions 36 and 38 and the drain regions 37 and 39 in a stacked-up type increases the surface areas of those regions, and therefore it becomes easy to secure a large connection area between the contact face and the source regions 36, 38 or the drain regions 37, 39 in contacting.

In integrated circuits made of DTMOS 3 and 4, the element area can be effectively decreased by using two kinds of element isolation regions 22 and 23 different in depth and by using a MOSFET element having the stacked-up type source regions 36 and 38 and drain regions 37 and 39. Particularly in the case where the shallow element isolation region 23 is made of STI, bird's beak is hardly generated. This makes it possible to prevent off leakage failure of PMOS 4 due to stress caused by bird's beak and enables best use of the characteristics of the stacked-up type source regions 36 and 38 and drain regions 37 and 39 being small in width.

According to the second embodiment, therefore, there is provided the integrated circuit that is free from off leakage failure of PMOS 4, enables further reduction of the element area, and includes DTMOS enabling high integration.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A method for fabricating a semiconductor device having:

a semiconductor substrate;

a first conductive-type deep well region formed inside the semiconductor substrate;

a second conductive-type shallow well region formed in the first conductive-type deep well region;

a dynamic threshold transistor formed on the second conductive-type shallow well region, a gate electrode of the dynamic threshold transistor being short-circuited to the second conductive-type shallow well region;

a shallow element isolation region formed on the second conductive-type shallow well region and composed of STI with a depth shallower than a depth of an interface between the first conductive-type deep well region and the second conductive-type shallow well region; and a deep element isolation region formed on the first conductive-type deep well region by penetrating through the second conductive-type shallow well region and having an approximately constant width and a depth deeper than the depth of the interface between the first conductive-type deep well region and the second conductive-type shallow well region, the method comprising the steps of:

forming a first film on a semiconductor substrate;

forming a first open window on the first film;

forming a first isolation trench by etching part of the semiconductor substrate with use of the first film as a mask;

forming a second film on the first film and the first isolation trench;

etching part of the first film with use of the second film as a mask;

forming a second isolation trench by partially etching the semiconductor substrate with use of the first film as a mask; and depositing an isolating film on the first film, the first isolation trench and the second isolation trench for filling the first isolation trench and the second isolation trench.

2. The method for fabricating the semiconductor device as defined in claim 1, wherein the first film is a laminated film made of a silicon oxide film and a silicon nitride film, the second film is a photoresist, and insulating film is an oxide film.

* * * * *